(12) United States Patent
Khiang

(10) Patent No.: US 7,023,076 B2
(45) Date of Patent: Apr. 4, 2006

(54) MULTIPLE CHIP SEMICONDUCTOR PACKAGES

(75) Inventor: Wang Chuen Khiang, Singapore (SG)

(73) Assignee: United Test & Assembly Center Limited, Singapore (SG)

( * ) Notice: Subject to any disclaimer, the term of this patent is extended or adjusted under 35 U.S.C. 154(b) by 0 days.

(21) Appl. No.: 10/347,356

(22) Filed: Jan. 21, 2003

(65) Prior Publication Data

US 2004/0012079 A1    Jan. 22, 2004

(30) Foreign Application Priority Data

Jul. 18, 2002    (SG) ............................ 2002-04392-5

(51) Int. Cl.
*H01L 23/02* (2006.01)

(52) U.S. Cl. ...................... 257/678; 257/686; 257/693; 257/675; 257/706; 257/666; 257/690; 257/697

(58) Field of Classification Search .............. 257/678, 257/686, 693, 675, 706, 666, 690, 697
See application file for complete search history.

(56) References Cited

U.S. PATENT DOCUMENTS

| | | | |
|---|---|---|---|
| 5,323,060 A | 6/1994 | Fogal et al. | |
| 5,793,108 A * | 8/1998 | Nakanishi et al. | 257/723 |
| 6,005,778 A | 12/1999 | Spielberger et al. | |
| 6,559,526 B1 * | 5/2003 | Lee et al. | 257/676 |
| 6,603,072 B1 * | 8/2003 | Foster et al. | 174/52.4 |
| 6,650,009 B1 * | 11/2003 | Her et al. | 257/686 |
| 2002/0090753 A1 | 7/2002 | Pai et al. | |
| 2003/0127719 A1 * | 7/2003 | Chang | 257/685 |

* cited by examiner

*Primary Examiner*—Steven Loke
*Assistant Examiner*—Junghwa Im
(74) *Attorney, Agent, or Firm*—Greenblum & Bernstein, P.L.C.

(57) ABSTRACT

A semiconductor package, containing two or more IC devices. The IC devices are oriented in the same manner and at least two IC devices are separated by a die paddle that is attached to the active face of one of the IC devices, inward of the electrical contact areas.

26 Claims, 2 Drawing Sheets

MULTIPLE CHIP SEMICONDUCTOR PACKAGES

The present invention relates to semiconductor packages and, in particular, to semiconductor packages containing more than one integrated circuit (IC) device and of the Dual In-line Package (DIP) family, the Small Outline Package (SOP) family or the Quad Flat Pack (QFP) package family.

The rapid growth of portable electronics and wireless communications apparatus has necessitated rapid development in the field of packaging IC devices; In particular, the rapid growth in the requirements of portable computer performance and the increase in features in portable electronics and wireless equipment is driving the requirement for the electronics packaging industry to produce devices with, for example, higher memory density. One solution is the emergence of multiple chip packaging (MCP). This is advantageous since the design life cycle of an IC chip may be from several months to one or two years. However, the life cycle of PCs, and electronics consumer products in general, are typically far shorter. Therefore incorporating two or more IC chips in a single package enables the density requirement of the product life cycle to develop without being hindered by the lag of the actual IC chip design cycle. FIGS. 1 and 2 of the accompanying drawings depict a conventional design for multiple chip packages. In FIG. 1, the semiconductor package 1 contains two IC devices 2, 3 bonded by adhesive layers 5, 6 to a die paddle 4. Each of the IC devices 2, 3 has electrical connection areas 2a, 3a through which electrical signals are transmitted between the IC devices 2, 3 and the apparatus in which the semiconductor package 1 is used. The electrical connection areas 2a, 3a are arranged around the periphery of the active surfaces of the IC devices 2, 3. In order to facilitate the electrical connections to these electrical connection areas 2a, 3a, the IC devices 2, 3 are attached back to back on the die paddle 4. That is to say, the passive face of each of the IC devices 2, 3 is bonded to the die paddle. The electrical connection areas 2a, 3a are wire bonded to the semiconductor package's external terminals (known as leads). This arrangement is, however, disadvantageous, especially when packaging two similar IC devices. The electrical connection area layout of the first of the IC devices 2 is a mirror image of the layout of the electrical connection areas on the second IC device 3. This significantly increases the complexity of the external electrical connections for connecting the semiconductor package 1 to the apparatus in which it is installed. This problem is conventionally overcome by either adding a redstribution layer to one of the IC devices 2, 3 so that the wire bond Connections to the leads can be similar for both chips or by having two IC device designs, each with the layout of the electrical connection areas being the mirror image of the other. Both solutions increase the cost of producing the semiconductor package and increase the number and complexity of the processing steps required and therefore increase the likelihood of production errors.

FIG. 2 shows a further conventional design for a multiple chip semiconductor package 21. Two IC devices 22, 23 are attached to a die paddle 24. One IC device 23 is attached as before, namely by means of an adhesive 26 bonding its passive side to the die paddle 24. The other IC device 22 is attached to the die paddle 24 by means of a flexible tape using a Tape Automatic Bonding (TAB) method which connects the electrical connection areas 22a of the IC device to the external terminals 27 of the semiconductor package 21. The electrical connection areas 23a of the first IC device 23 are wire bonded to the external leads 27. However, in order to prevent shorting between the electrical connection areas 22a on the second IC device 22, flip-chip bumps 25 must be applied to the electrical connection areas 22a of the IC device 22. This both increases the number of operations required to produce the semiconductor package, and hence its cost, but also increases the complexity since the IC devices must be separated into upper chips, to be wire bonded as usual, and lower chips with bumped electrical connection areas. Once IC devices have been designated as lower chips 32 and bumped, they cannot be used as upper chips. Furthermore, since this device uses two attachment techniques, namely wire bonding and tape automatic bonding, equipment for both these techniques will be required, increasing the cost of production still further.

It is therefore an object of the present invention to provide a semiconductor package and a method for its manufacture that contains multiple IC devices but which can be manufactured cheaply and reliably.

According to the present invention there is provided a semiconductor package comprising:

a first IC device with a plurality of electrical connection areas on a periphery of an active face a die paddle, attached to the active face of the first IC device, inward of the plurality of electrical connection areas, the active face of the first IC device being attached to the die paddle, wherein the die paddle does not cover the electrical connection areas of the first IC device;

a second IC device, a passive face of which is attached to the die paddle, and having a plurality of electrical connection areas on an active face of the second IC device opposite the passive face;

electrical connections between the electrical connection areas on the first and second IC devices and a plurality of external electrical terminals that protrude from the package.

This package is advantageous since fewer processing steps are required to produce it than conventional MCP packages. In addition, conventional techniques for connecting the electrical connection areas to the external terminals can be used but the IC devices are oriented the same way and therefore the layout of the electrical connection areas is the same for both IC devices rather than being mirror images.

In a preferred embodiment of the present invention, the electrical connection areas on the second IC device are arranged on the periphery of its active face and the semiconductor package further comprises a third IC device, the passive side of which is attached to the active side of the second IC device, inward of the electrical connection areas on the second IC device and electrical connections are provided between the electrical connection areas on the third IC device and external electrical terminals that protrude from the package. This is advantageous since the inclusion of a third IC device increases the function density of the package without significantly increasing the complexity of producing the semiconductor package. Specifically, all three of the IC devices are oriented the same way. This simplifies the connections between the semiconductor package and the apparatus in which it is installed.

In an alternative embodiment of the invention, electrical connection areas on at least one of the IC devices are wire bonded to the external electrical terminal. This technique is well-known and understood and therefore the costs associated with it are relatively low.

In a yet further preferred embodiment of the present invention, the electrical connection areas on one of the IC devices are connected to the external electrical terminals using tape automatic bonding. This is advantageous since the use of tape automatic bonding enables a tighter pitch electrical connection between bond pads and the external electrical terminals. Furthermore the use of tape automatic bonding is advantageous since it eliminates the risk of shorts between connections created by the limited space. This method of connection also reduces the time taken to assemble the semiconductor package.

According to a second aspect of the present invention, there is provided a method of assembling a semiconductor package comprising:

attaching a die paddle to the an active face of a first IC device, inward of a plurality of electrical connection areas on a periphery of the active face of said first IC device;

forming electrical connections between said plurality of electrical connection areas on the first IC device and external electrical terminals;

attaching the passive face of a second IC device to the die paddle; and forming electrical connections between electrical contact areas on an active face of the second IC device and external electrical terminals.

The invention will now be described by way of non-limiting examples with reference to the accompanying drawings, in which.

In the Figures, like parts have like reference numerals.

Figure 1:
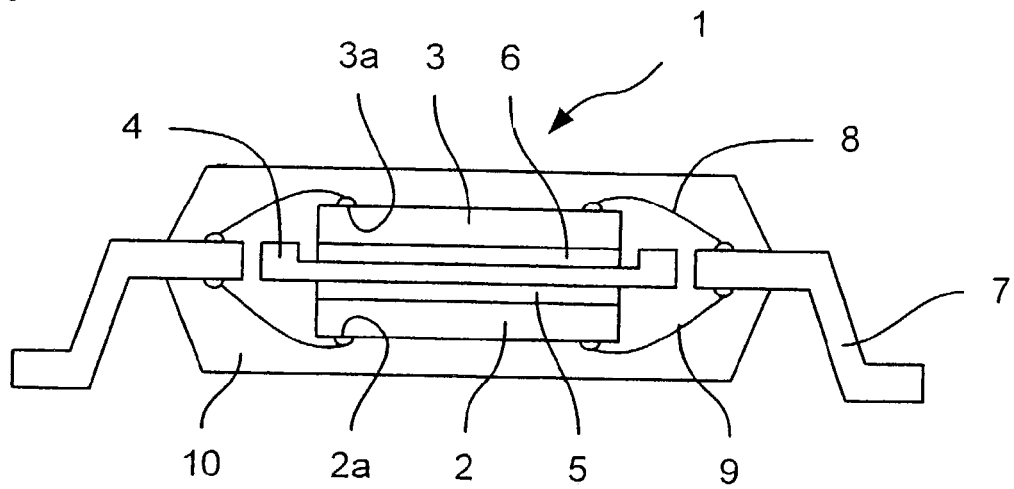
FIG. 1 is a sectional view of a conventional multiple chip semiconductor package.
Figure 2:
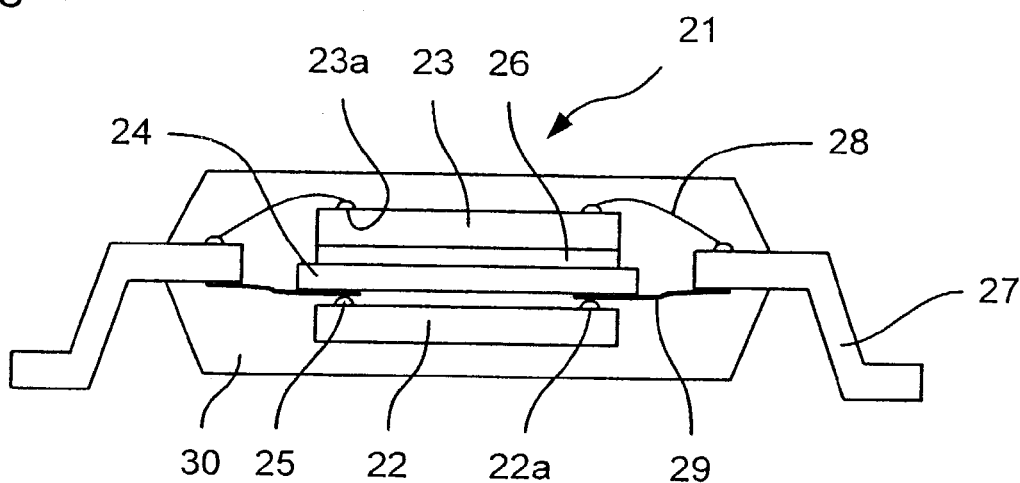
FIG. 2 is a sectional view of an alternative design for a conventional multiple chip semiconductor package.
Figure 3:
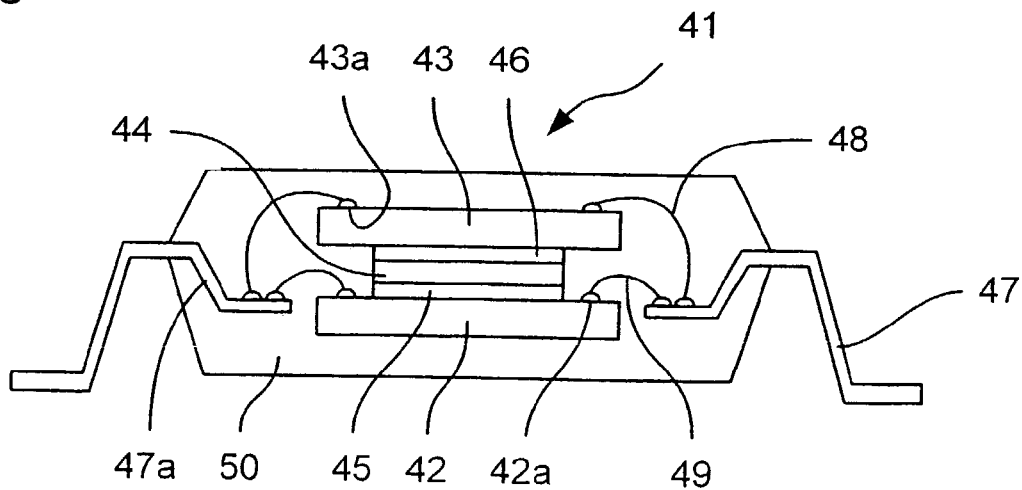
FIG. 3 is a sectional view of a multiple chip semiconductor package according to the present invention.

FIG. 3 shows a semiconductor package 41 of the present invention. Two IC devices 42, 43 are joined by means of a die paddle 44 which functions as a spacer. The die paddle 44 is attached to the active face of the first IC device 42 by means of adhesive 45. The electrical contact areas 42a on the first IC device 42 are arranged around the periphery of the active face of the IC device. The die paddle 44 is attached in the middle of active face, inward of the electrical contact areas 42a, and therefore does not interfere with the electrical connection made to the electrical connection areas 42a. The passive side of the second IC device 43 is attached, by means of adhesive 46, to the other side of the die paddle 44 to the first IC device. Therefore both IC devices 42, 43 are oriented in the same manner (active side up in the arrangement shown in FIG. 3). Therefore the layout of the electrical connection areas 42a, 43a is the same for like IC devices. It should be noted, that although the present invention is specially advantageous for semiconductor packages containing two or more IC devices that are the same, the present invention is not limited to this and may be used with semiconductor packages containing IC devices of different types and different sizes.

The electrical connection areas 42a, 43a are connected to the external electrical terminals 47 by means of wire bonded connections 48, 49. Typically, different electrical connection areas 42a, 43a will be connected to different electrical terminals 47. The IC devices 42, 43, the die paddle 44 and the connections between the electrical connection areas 42a, 43a and the external electrical terminals are enclosed within a housing 50. This housing may be an encapsulant, formed by, for example, a liquid process or by a transfer moulding method. The housing may also be comprised of a base with a sealed lid to cover the IC devices and connections. The function of the housing is to protect the IC devices and the connections from physical damage and damage caused by the environment.

In order to assemble the semiconductor package 41, the die paddle 44 is attached to the first IC device 42. Next the electrical connection areas 42a on the first IC device 42 are wire bonded to the external electrical terminals 47. The second IC device 43 is subsequently attached to the die paddle 44, the depth of the die paddle 44 ensuring that there is sufficient clearance between the first and second IC devices 42, 43 to ensure that the second IC device 43 does not interfere with the wire bond connection 49 between the first IC device and the external electrical terminals. The electrical connection areas 43a on the second IC device 43 are then wire bonded to further external electrical terminals 47. Finally, the IC devices 42, 43, the die paddle 44 and the connections 48, 49 between the IC devices and the external electrical terminals 47 are enclosed in the housing 50. It will be appreciated that the first two steps may easily be reversed, namely the electrical connection areas 42a on the first IC device 42 may be wire bonded to the external electrical terminals 47 prior to the die paddle 44 being attached to the first substrate 42. Likewise the ordering of the first and second IC devices (namely the IC device with the die paddle attached to its active face and the IC device with the die paddle attached to its passive face, respectively) can be reversed.

As shown in FIG. 3, the external electrical terminals 47 are down-set. That is to say the section 47a of the external electrical terminal that is contained within the housing 50 is bent down to be at a similar level to the lower of the IC devices. The present invention is not, however, limited to this and the external electrical terminals may be up-set to be at a level similar to the upper IC device.

As depicted in FIG. 3 the electrical connection areas 42a, 43a on the IC devices 42, 43 are arranged around the periphery of the active faces of the IC devices 42, 43. However, this need not be the case. The present invention may use IC devices in which the electrical connection areas are not located on the periphery of the active face. For example, the electrical connection areas may be located in one or two rows arranged about the central axis of the active face of the IC device. When such IC devices with electrical contact areas arranged other than around the periphery are used with the present invention, it may be necessary to add a wafer redistribution layer to the IC device. The redistribution layer, which may, for example, be a wafer redistribution layer, provides electrical connections between the electrical contact regions in, for example, the centre of the active face of the IC device and electrical contact regions on the periphery of the redistribution layer. In effect, the redistribution layer moves the electrical contact areas to the periphery of the IC device thus facilitating the function of the present invention. Whilst the use of the redistribution layer is especially useful for an IC device which has the die paddle attached to its active face, it may also be useful for an IC device that has the die paddle attached to its passive face since it will reduce the distance that the wire bonds have to reach.

The adhesive used to attach the IC devices to the die paddle may be in the form of an adhesive paste, coating or film. Furthermore, although the IC devices 42, 43 shown in FIG. 3 are of the same size, the present invention is not limited to this and the IC devices may perform different functions and be of differing sizes.

Figure 4:
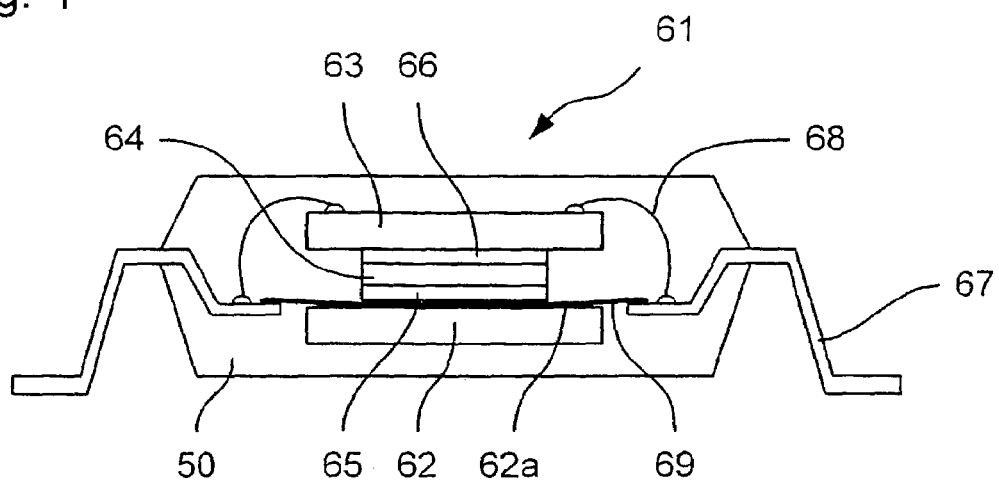
FIG. 4 is a sectional view of an alternative multiple chip semiconductor package according to the present invention.

FIG. 4 shows a variation of the embodiment of the present invention shown in FIG. 3. In this cause the electrical contact areas 62a on the first IC device 62 are connected to the external electrical terminals 67 by means of tape automatic bonding In this case the semiconductor package is assembled by first attaching the flex-tape 69 to the first IC device 62 and then attaching the die paddle 64 with an adhesive 65 to the flex-tape. The remainder of the process is the same and its description will not be repeated.

Figure 5:
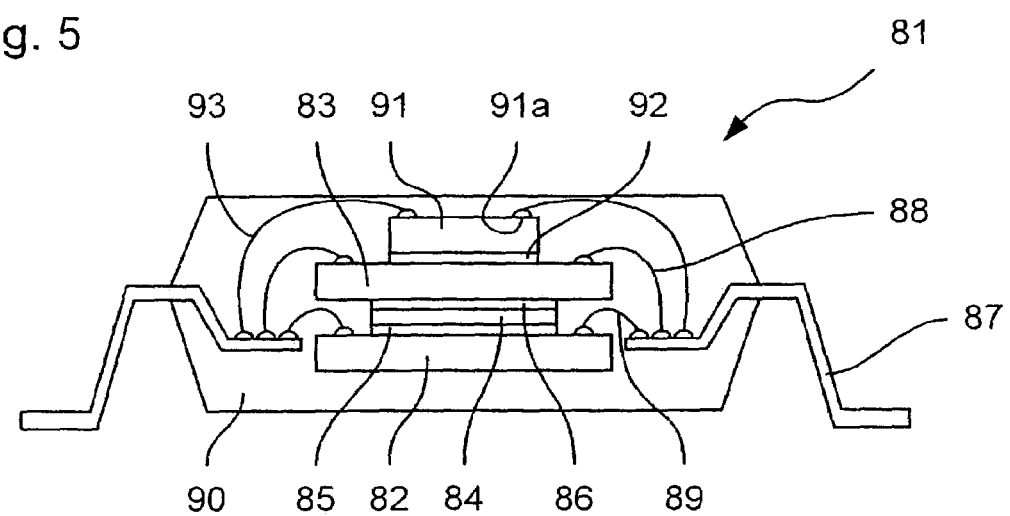
FIG. 5 is a sectional view of a further alternative multiple chip semiconductor package according to the present invention.

FIG. 5 shows a further variation of the embodiment of the present invention shown in FIG. 3. A third IC device is included in the semiconductor package. The passive face of the third IC device 91 is connected to the active face of the second IC device. Therefore all three IC devices are oriented in the same manner, namely active face upwards in the arrangement shown in FIG. 5. In the embodiment shown in FIG. 5 the third IC device 91 is smaller than the second IC device 83 and is attached with adhesive 92 directly to the active face of the second IC device 83, inwards of the electrical contact areas 83a of the second IC device 83. The present invention is not limited to this however and the third IC device may be attached by means of a second die paddle, in which case the third IC device may be the same size as, or bigger than, the first and second IC devices, 82, 83. The electrical contact regions 91a on the third IC device 91 are connected either by wire bonding (as shown in FIG. 5) or by tape automatic bonding to the external electrical terminals 87. Similarly, further IC devices may be successively attached on top of the third IC device 91 by any of the above-described methods, as required.

The present disclosure relates to subject matter contained in priority Singapore Patent Application No. 200204392-5, filed on Jul. 18, 2002, the contents of which is herein expressly incorporated by reference in its entirety.

What is claimed is:

1. A semiconductor package, comprising:
a first IC device with a plurality of electrical connection areas on a periphery of an active face;
a die paddle, directly attached to the active face of the first IC device, inward of the electrical connection areas, the die paddle being sized such that it does not cover the plurality of electrical connection areas of the first IC device;
a second IC device, a passive face of the second IC device being directly attached to the die paddle, and having a plurality of electrical connection areas on an active face opposite the passive face; and
electrical connections between the plurality of electrical connection areas of the first and second IC devices and a plurality of external electrical terminals that protrude from the package, an end portion of at least one of the plurality of external electrical terminals being bent down such that the end portion is approximately level with the active face of the first IC device;
wherein the first and second IC devices, the die paddle, the electrical connections, and a portion of each of the plurality of external electrical terminals are enclosed by an encapsulation.

2. A semiconductor package according to claim 1, wherein the plurality of electrical connection areas on the second IC device are arranged on a periphery of the active face; and further comprising:
a third IC device, a passive side of which is attached to the active side of the second IC device, inward of the electrical connection areas on the second IC device; and
electrical connections between a plurality of electrical connection areas on a third IC device and said plurality of external electrical terminals that protrude from the package.

3. A semiconductor package according to claim 1, wherein the plurality of electrical connection areas on at least one of the first and second IC devices are wire bonded to the plurality of external electrical terminals.

4. A semiconductor package according to claim 1, wherein the plurality of electrical connection areas on the first and second IC devices are wire bonded to the plurality of external electrical terminals.

5. A semiconductor package according to claim 1, wherein the plurality of electrical connection areas on one of the first and second IC devices are connected to the plurality of external electrical terminals using tape automatic bonding.

6. A method of assembling a semiconductor packages comprising:
directly attaching a die paddle to an active face of a first IC device, inward of a plurality of electrical connection areas on a periphery of the active face of said first IC device;
forming electrical connections between said plurality of electrical connection areas on the first IC device and a plurality of external electrical terminals;
directly attaching a passive face of a second IC device to the die paddle;
forming electrical connections between the plurality of electrical contact areas on an active face of the second IC device and the plurality of external electrical terminals; and
enclosing the first and second IC devices, the die paddle, the electrical connections, and a portion of each of the plurality of external electrical terminals in an encapsulation,
bending down an end portion of at least one of the plurality of external electrical terminals such that the end portion is approximately level with the active face of the first IC device.

7. A method of assembling a semiconductor package according to claim 6, wherein the plurality of electrical contact areas on the active face of the second IC device are arranged on a periphery of the active face; the method further comprising:
attaching a passive face of a third IC device to the active face of the second IC device, inward of the plurality of electrical contact areas on the second IC device; and
forming electrical connections between a plurality of electrical contact areas on the active face of the third IC device and the plurality of external electrical terminals.

8. A method of assembling a semiconductor package according to claim 6, wherein the plurality of electrical connections between the plurality of external electrical terminals and the plurality of electrical contact areas of one of the first and second IC devices are formed by a wire bonding method.

9. A method of assembling a semiconductor package according to claim 6, wherein the electrical connections between the plurality of external electrical terminals and the plurality of electrical contact areas of the first and second IC devices are formed by a wire bonding method.

10. A method of assembling a semiconductor package according to claim 6, wherein the plurality of electrical connection between the plurality of external electrical terminals and the plurality of electrical contact areas of one of the first and second IC devices are formed by a tape automatic bonding method.

11. A semiconductor package according to claim 2, wherein the plurality of electrical connection areas on at least one of the first, second, and third IC devices are wire bonded to the plurality of external electrical terminals.

12. A semiconductor package according to claim 2, wherein the plurality of electrical connection areas on the first, second, and third IC devices are wire bonded to the plurality of external electrical terminals.

13. A semiconductor package according to claim 3, wherein the plurality of electrical connection areas on the first and second IC devices are wire bonded to the plurality of external electrical terminals.

14. A semiconductor package according to claim 2, wherein the plurality of electrical connection areas on one of the first, second, and third IC devices are connected to the plurality of external electrical terminals using tape automatic bonding.

15. A semiconductor package according to claim 3, wherein the plurality of electrical connection areas on one of the first and second IC devices are connected to the plurality of external electrical terminals using tape automatic bonding.

16. A method of assembling a semiconductor package according to claim 7, wherein the plurality of electrical connections between the plurality of external electrical terminals and the plurality of electrical contact areas of one of the first, second, and third IC devices are formed by a wire bonding method.

17. A method of assembling a semiconductor package according to claim 7, wherein the plurality of electrical connections between the plurality of external electrical terminals and the plurality of electrical contact areas of the first, second, and third IC devices are formed by a wire bonding method.

18. A method of assembling a semiconductor package according to claim 8, wherein the plurality of electrical connections between the plurality of external electrical terminals and the plurality of electrical contact areas of the first and second IC devices are formed by a wire bonding method.

19. A method of assembling a semiconductor package according to claim 7, wherein the plurality of electrical connection between the plurality of external electrical terminals and the plurality of electrical contact areas of one of the first, second, and third IC devices are formed by a tape automatic bonding method.

20. A method of assembling a semiconductor package according to claim 8, wherein the plurality of electrical connection between the plurality of external electrical terminals and the plurality of electrical contact areas of one of the first and second IC devices are formed by a tape automatic bonding method.

21. The semiconductor package according to claim 1, wherein the passive face of the first IC device is free from attachment to a substrate.

22. The method of assembling a semiconductor package according to claim 6, wherein the encapsulation is provided such that the passive face of the first IC device is free from attachment to a substrate.

23. A semiconductor package according to claim 1, wherein the bent down end portion of each of the external electrical terminals includes a plurality of electrical connection areas which the electrical connection areas of the first and second IC devices can connect to.

24. A semiconductor package according to claim 23 wherein the plurality of electrical connection areas of the external electrical terminals are substantially level.

25. The semiconductor package of claim 1, wherein electrical connections are made to the bent down end portion approximately level with the active face of the first IC device.

26. The method of claim 6, wherein the electrical connections are formed on the bent down end portion.

* * * * *

UNITED STATES PATENT AND TRADEMARK OFFICE
CERTIFICATE OF CORRECTION

| | | |
|---|---|---|
| PATENT NO. | : 7,023,076 B2 | Page 1 of 1 |
| APPLICATION NO. | : 10/347356 | |
| DATED | : April 4, 2006 | |
| INVENTOR(S) | : Wang Chuen Khiang | |

It is certified that error appears in the above-identified patent and that said Letters Patent is hereby corrected as shown below:

Please insert claim 6 at column 6, line 18 (col. 6 claim 6, line 1) of the printed patent, "packages" should be --package,--.

Signed and Sealed this

Twenty-sixth Day of December, 2006

JON W. DUDAS
*Director of the United States Patent and Trademark Office*